(12) United States Patent
Roukos et al.

(10) Patent No.: US 9,735,742 B2
(45) Date of Patent: Aug. 15, 2017

(54) MULTI-PORT AMPLIFIER UTILIZING AN ADJUSTABLE DELAY FUNCTION

(71) Applicant: THE BOEING COMPANY, Chicago, IL (US)

(72) Inventors: Daniel S. Roukos, Chicago, IL (US); John A. Fleming, Chicago, IL (US)

(73) Assignee: The Boeing Company, Chicago, IL (US)

( * ) Notice: Subject to any disclaimer, the term of this patent is extended or adjusted under 35 U.S.C. 154(b) by 44 days.

(21) Appl. No.: 14/805,181

(22) Filed: Jul. 21, 2015

(65) Prior Publication Data

US 2017/0026006 A1 Jan. 26, 2017

(51) Int. Cl.
| | |
|---|---|
| H03F 3/68 | (2006.01) |
| H03F 1/42 | (2006.01) |
| H03F 1/02 | (2006.01) |
| H03F 3/19 | (2006.01) |
| H03F 3/21 | (2006.01) |

(52) U.S. Cl.
CPC ............. *H03F 1/42* (2013.01); *H03F 1/0205* (2013.01); *H03F 3/19* (2013.01); *H03F 3/211* (2013.01); *H03F 2200/451* (2013.01); *H03F 2203/21106* (2013.01)

(58) Field of Classification Search
CPC ........................................................ H03F 3/68
USPC ................................ 330/124 R, 53, 302, 295
See application file for complete search history.

(56) References Cited

U.S. PATENT DOCUMENTS

| | | | | | |
|---|---|---|---|---|---|
| 5,831,478 | A | * | 11/1998 | Long ..................... | H03F 1/3229 330/151 |
| 5,884,143 | A | * | 3/1999 | Wolkstein ............... | H03F 1/526 330/107 |
| 7,110,739 | B2 | * | 9/2006 | Braithwaite ......... | H04B 1/0483 330/151 |
| 2002/0153972 | A1 | * | 10/2002 | Hershtig ................. | H01P 1/205 333/202 |
| 2004/0257170 | A1 | * | 12/2004 | Stenberg ................. | H01P 1/122 333/117 |
| 2009/0096525 | A1 | * | 4/2009 | Staszewski ............. | H03F 3/189 330/277 |
| 2012/0224653 | A1 | * | 9/2012 | Lozhkin ................ | H03F 1/0294 375/297 |
| 2013/0136209 | A1 | * | 5/2013 | Saunders .............. | H04L 27/362 375/316 |

* cited by examiner

*Primary Examiner* — Patricia T Nguyen
(74) *Attorney, Agent, or Firm* — Francisco A. Rubio-Campos; Apogee Law Group P.C.

(57) ABSTRACT

Disclosed is a multi-port power amplifier ("MPA") having an input hybrid matrix ("IHM"), an output hybrid matrix ("OHM"), and a plurality of high-power amplifier ("HPA") chains. The MPA may include a plurality of adjustable delay modules ("ADMs") in signal communication with the IHM and the plurality of HPA chains. Each adjustable delay module ("ADM") of the plurality of ADMs may be in signal communication with the IHM and a corresponding HPA chain of the plurality of HPA chains.

20 Claims, 7 Drawing Sheets

MULTI-PORT AMPLIFIER UTILIZING AN ADJUSTABLE DELAY FUNCTION

BACKGROUND OF THE INVENTION

1. Field of the Invention

The present invention relates generally to satellite communication systems, and more generally to multi-port power amplifiers ("MPAs") utilized in satellite communication systems.

2. Related Art

In today's modern society satellite communication systems have become common place. There are now numerous types of communication satellites in various orbits around the Earth transmitting and receiving huge amounts of information. Telecommunication satellites are utilized for microwave radio relay and mobile applications, such as, for example, communications to ships, vehicles, airplanes, personal mobile terminals, Internet data communication, television, and radio broadcasting. As a further example, with regard to Internet data communications, there is also a growing demand for in-flight Wi-Fi® Internet connectivity on transcontinental and domestic flights. Unfortunately, because of these applications, there is an ever increasing need for the utilization of more communication satellites and the increase of bandwidth capacity of each of these communication satellites.

In FIG. 1, a system diagram of an example of an implementation of a known communication satellite 100 is shown orbiting the Earth 102. In this example, the communication satellite 100 is shown orbiting the Earth 102 at distance 104 of about 36,000 kilometers ("km") and illuminating part of the North American continent with a single beam 106 that results in a single satellite footprint 108 illuminating part of the North American continent. It is appreciated by those of ordinary skill in the art that the type of orbit and distance 104 of the communication satellite 100 may vary based on the mission and/or function of the communication satellite 100. For example, the communication satellite 100 may be a geostationary satellite that has an approximate constant distance 104 from the satellite footprint 108 (and a constant approximate 36,000 km distance from the equator of the Earth), a non-geostationary geosynchronous satellite that has an approximate constant distance 104 at a particular time each day, or a non-geosynchronous satellite (such as for example a low or medium Earth orbit satellite) that has a varying distance 104. Unfortunately, in this example the known communication satellite 100 is a single beam communication satellite with limited bandwidth capacity.

Known approaches to increase the bandwidth capacity utilize high level frequency re-use and/or spot beam technology which enables the frequency re-use across multiple narrowly focused spot beams. These known approaches typically involve the use of multi-beam communication satellite systems instead of a signal beam communication satellite 100 as shown in FIG. 1.

Turning to FIG. 2, a system diagram of an example of an implementation of a known multi-beam communication satellite 200 is shown orbiting the Earth 102. Unlike the example in FIG. 1, in this example the multi-beam communication satellite 200 is shown illuminating parts of the North American continent with multiple beams 202, 204, and 206 that result in multiple satellite footprints 208, 210, and 212, respectively, illuminating parts of the North American continent. The multi-beam communication satellite 200 is also shown orbiting the Earth 102 at a distance 214 that may also vary (as in the example of FIG. 1) based on whether the multi-beam communication satellite 200 is a geostationary satellite that has an approximate constant distance 214 from the footprints 208, 210, and 212, a non-geostationary geosynchronous satellite that has an approximate constant distance 214 at a particular time each day, or a non-geosynchronous satellite that has a varying distance 214. The multi-beam communication satellite 200 covers the same approximate combined footprint area (i.e., footprints 208, 210, and 212 combined) as the single footprint 108 of the single beam communication satellite 100, shown in FIG. 1. However, in this example, the multi-beam communication satellite 200 is capable of obtaining higher antenna gains in each individual beam 202, 204, and 206 than the antenna gain of the single beam 106 of the signal beam communication satellite 100. This results in the multi-beam communication satellite 200 having an improved equivalent isotropically radiated power ("EIRP") and antenna gain-to-noise temperature ("G/T"), which results in improved bandwidth capacity.

Generally, these type of known multi-beam communication satellites 200 are effective for mobile communications or multi-media access networks because they have reduced transmitting power requirements and increased receiving power ability. However, these known systems do have a number of problems. As an example, their users may move from one geographic location to another and communication traffic may not be uniform among the multiple beams 202, 204, and 206 and may fluctuate over time. Moreover, generally these systems have insufficient beam 202, 204, and 206 isolation that may result in multi-path interference in the surrounding areas due to leakage through the adjacent beams 202, 204, and 206. As such, these types of multi-beam communication satellites 200 need a high power amplifier system that is capable of providing efficient transmitting power utilization with sufficient beam 202, 204, and 206 isolation.

At present, a well-known technique for providing this type of high power amplifier system is to utilize a multi-port power amplifier ("MPA"), also known as simply a "multi-port amplifier." An MPA is a system that includes a power divider, power combiner, and an array of high power amplifiers ("HPAs"). In general, an MPA has a number N of similar HPAs in parallel, each having a power P, so that each input signal is amplified equally by each HPA, to potentially increase the power of an output signal by a factor N, to a total power equal to P multiplied by N. The N input ports and N output ports are provided, so that an input signal on one input port is routed to the corresponding output port. In general, the N is equal to the total number of input ports and output ports and also equal to $2^n$, where n is an integer equal to or greater than 2.

More specifically, in FIG. 3, a block diagram of an example of an implementation of a known MPA 300 is shown. The MPA 300 may include an input network which is an input hybrid matrix ("IHM") 302, an output network which is an output hybrid matrix ("OHM") 304, a plurality of tuning mechanisms 306, 308, and 310, and a plurality of high power amplifiers ("HPAs") 312, 314, and 316. In this example, the IHM 302 includes input ports 318, 320, and 322 and the OHM 304 includes output ports 324, 326, and 328.

In this example, the IHM 302 is shown in signal communication with the tuning mechanisms 306, 308, and 310 via signal paths 330, 332, and 334, respectively. Similarly, The OHM 304 is shown in signal communication with the HPAs 312, 314, and 316 via signal paths 336, 338, and 340, respectively. The first tuning mechanism 306 is in signal communication with the first HPA 312 via signal path 342. Similarly, the second tuning mechanism 308 is in signal communication with the second HPA 314 via signal path 344. Moreover, the third tuning mechanism 310 is in signal communication with the third HPA 316 via signal path 346.

Further in this example, the IHM 302 is generally a power divider and the OHM 304 is generally a power combiner. As an example, the IHM 302 and OHM 304 may be two complementary N by N (i.e., N×N) Butler matrix networks that include a plurality of 90 degree hybrid networks (not shown). Additionally, each tuning mechanism 306, 308, and 310 is generally an equalizer and each HPA 312, 314, and 316 may be an amplifier unit such as, for example, a traveling wave tube amplifier ("TWTA") or solid state amplifier. Specifically, each equalizer may provide, as a minimum, adjustment of gain and phase response and may also provide a single gain and phase adjustment, or multiple adjustments based on the frequency and amplitude of the intermediate signals provided by the IHM 302.

It is appreciated by those of ordinary skill in the art that in this example while only three (3) tuning mechanisms 306, 308, and 310, three (3) HPAs 312, 314, and 316, three (3) input ports 318, 320, and 322, and three (3) output ports 324, 326, and 328 output ports are shown, this number is for convenience of illustration and it is appreciated that there may be N tuning mechanisms, HPAs, input ports, and output ports. In general, each combination of tuning mechanism and HPA may be considered a HPA chain (resulting in a plurality of HPA chains 348) because it is appreciated that while each tuning element 306, 308, and 310 is shown prior to each HPAs 312, 314, and 316, respectively, in FIG. 3, the order may be optionally reversed with the reversed HPA chain still being functionally equivalent.

In general, MPAs have numerous advantages over classical amplification architectures (i.e., with one power amplifier per beam) provided that the operating point is carefully chosen. The MPA 300 allows the discrete amplifiers (i.e., the HPA 312, 314, and 316) to handle unbalanced traffic among beams and traffic variations over time while providing a common power pool.

In an example of operation, an input signal 350 may be injected into the first port 318 of the IHM 302 to produce an output signal 352 at the first output port 324. In any input signal injected into any of the input ports 318, 320, and 322 is divided into N intermediate signals 354, 356, and 358 that are passed to the tuning mechanisms 306, 308, and 310 and HPA 312, 314, and 316 chains. The N intermediate signals 354, 356, and 358 have particular phase relationships in that the first intermediate signal 352 may have a relative phase value of 0 degrees while the second intermediate signal 354 may have a relative phase value of 90 degrees.

As an example, if the IHM 302 is a 4 by 4 Butler matrix, there would be four (4) output intermediate signals (i.e., a first intermediate signal 354, second intermediate signal 356, a third intermediate signal (not shown), and a fourth intermediate signal 358) with varying phase values. As an example, the first intermediate signal 354 may have a relative phase value of 0 degrees and the second intermediate signal 356 may have a relative phase value of 90 degrees. The third intermediate signal may have a relative phase value of negative 90 degrees and the fourth intermediate signal 358 may have a relative phase value of 180 degrees. If the OHM 304 is also a 4 by 4 Butler matrix, the amplified and tuned intermediate signals would then be combined in a way that would result in first port 324 producing the output signal 352 that would be combination of all the tuned and amplified intermediate signals (i.e., the first intermediate signal 354, second intermediate signal 356, a third intermediate signal (not shown), and the fourth intermediate signal 358). The other output ports (i.e., second output port 326, third output port (not shown), and fourth output port 326) would not produce any output signals because they would be all phase cancelled out based on the respective phases of the four tuned and amplified intermediate signals.

Based on this, the advantage of utilizing an MPA is that it is an amplification architecture that provides intrinsic power flexibility since the power is shared between the channels (i.e., input ports 318, 320, and 322, the HPA chains 348, and output ports 324, 326, and 328). As such, the combined power of all the HPA chains 348 is available for any channel (i.e., output port 324, 326, and 328), provided that the other channels do not require power at the same time. This power flexibility is obtained without having to increase the power consumption.

Unfortunately, while very useful, MPAs have a number of inherent problems that affect their performance and therefore also affects the performance of the multi-beam communication satellite 200. Specifically, while the MPA 300 generally provides a pool of power that may be variably distributed among its multiple ports (i.e., channels), a drawback of MPAs is related to isolation losses between channels (i.e., the multiple ports 318, 320, and 322) due to different electrical characteristics of each path. Additionally, since all the input signals to the MPA 300 are amplified by each HPA 312, 314, and 316, multicarrier operation is reached even when a single carrier is introduced at each input port 318, 320, and 322.

Specifically, when the MPA 300 is free of errors, the various output signals 352, 360, and 362 exit the OHM 304 with complete isolation from each other; however, small errors anywhere within the MPA 300 may produce significant leakage of signals throughout the other (i.e., undesired) output ports. As an example, any errors in the MPA 300 may cause the desired output signal 352 to be leaked (as leakage signals 360 and 362) out of the other output ports 326 and 328 to produce a leakage of the output signal into the other ports 364.

As an example, some of these errors may be from the individual HPA 312, 314, and 316 that may introduce significant errors which will change over life, temperature and use of redundant or alternative units. The interconnecting transmission lines of signal paths 330, 332, 334, 336, 338, 340, 342, 344, and 346 and the imperfections in the tuning mechanisms 306, 308, and 310 may also contribute to the imbalance of the intermediate signals 354, 356, and 358 that may result in leakage throughout the MPA 300.

Known approaches for attempting to control MPA 300 alignment generally include two parts that include first providing mechanisms for tuning the MPA 300 adjustment and then determining the amount of adjustment to be made at each tuning mechanism 306, 308, and 310. Unfortunately, most of these known approaches require injecting special test signals into the MPA 300 input ports 318, 320, and 322 or at various interim locations internal (not shown) to the MPA 300, and then extracting the test signal from the output ports 324, 326, and 328. Often these approaches consume an output port 324, 326, and 328 of the MPA 300 for calibration purposes and the adjustments are often performed by trial-and-error, or by ad-hoc methods to minimize the leakage. Moreover, these approaches generally require extensive spacecraft hardware for making accurate measurements on the spacecraft and challenges still exist in directly measuring the phase and amplitude accurately from the ground.

Additionally, these approaches typically involve tuning the MPA 300 at a single frequency which generally only results in good performance near that specific frequency and is limited in maintaining that performance across a wide bandwidth of operation because of the varying frequency responses of each amplifier path (i.e., each signal path across each HPA of the HPA chains 348) across the bandwidth of operation. Moreover, these approaches generally require extensive spacecraft hardware for making accurate measurements on the spacecraft and challenges still exist in directly measuring the phase and amplitude accurately from the ground.

As such, there is a need for a system and method for making accurate phase and amplitude error corrections across a wide bandwidth of operation of an MPA so as to allow higher performance of the MPA across the wide bandwidth.

SUMMARY

Disclosed is an improved multi-port power amplifier ("MPA") having an input hybrid matrix ("IHM"), an output hybrid matrix ("OHM"), and a plurality of high-power amplifier ("HPA") chains. The MPA may include a plurality of adjustable delay modules ("ADMs") in signal communication with the IHM and the plurality of HPA chains. Each adjustable delay module ("ADM") of the plurality of ADMs may be in signal communication with the IHM and a corresponding HPA chain of the plurality of HPA chains.

As an example of operation, the improved MPA has improved performance across an operational bandwidth that has a first-end frequency, a center frequency, and a second-end frequency, where each HPA chain (of the plurality of HPA chains) has a corresponding frequency response across the operational bandwidth that includes a phase response that slopes from the first-end frequency to the second-end frequency. The improved MPA performs a method that includes adjusting a delay of each HPA chain such that the slope of the corresponding phase response of each HPA chain is tilted relative to the other phase responses of the other HPA chains of the plurality of HPA chains.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Disclosed is an improved multi-port power amplifier ("MPA") having an input hybrid matrix ("IHM"), an output hybrid matrix ("OHM"), and a plurality of high-power amplifier ("HPA") chains. The MPA may include a plurality of adjustable delay modules ("ADMs") in signal communication with the IHM and the plurality of HPA chains. Each adjustable delay module ("ADM") of the plurality of ADMs may be in signal communication with the IHM and a corresponding HPA chain of the plurality of HPA chains.

As an example of operation, the improved MPA has improved performance across an operational bandwidth that has a first-end frequency, a center frequency, and a second-end frequency, where each HPA chain (of the plurality of HPA chains) has a corresponding frequency response across the operational bandwidth that includes a phase response that slopes from the first-end frequency to the second-end frequency. The improved MPA performs a method that includes adjusting a delay of each HPA chain such that the slope of the corresponding phase response of each HPA chain is tilted relative to the other phase responses of the other HPA chains of the plurality of HPA chains.

Figure 2:
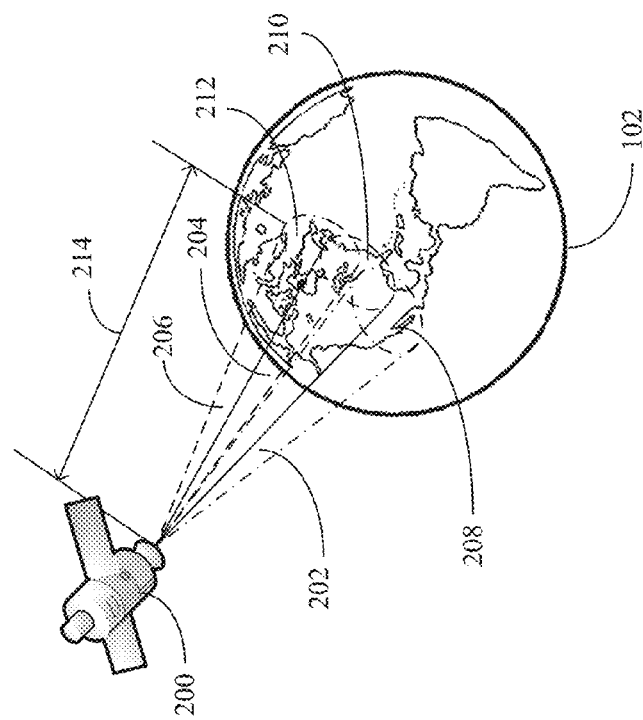
FIG. 2 is a system diagram of an example of an implementation of a known multi-beam communication satellite orbiting the Earth.
Figure 1:
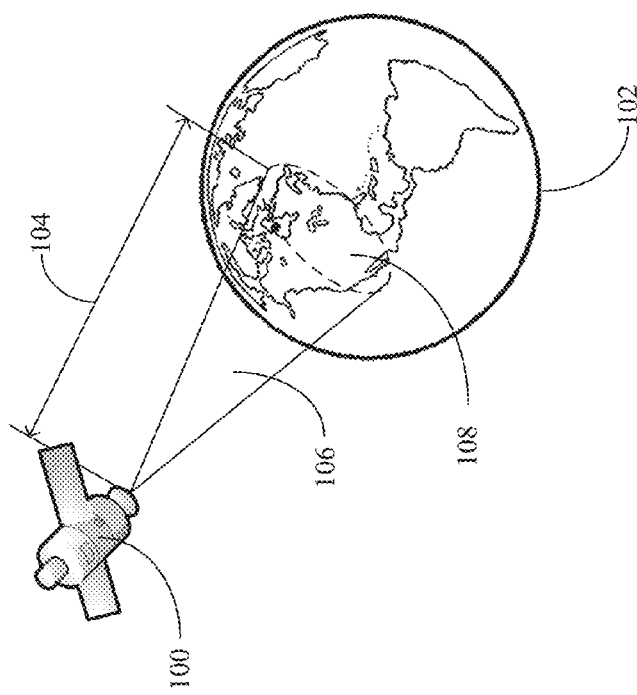
FIG. 1 is a system diagram of an example of an implementation of a known communication satellite orbiting the Earth.
Figure 3:
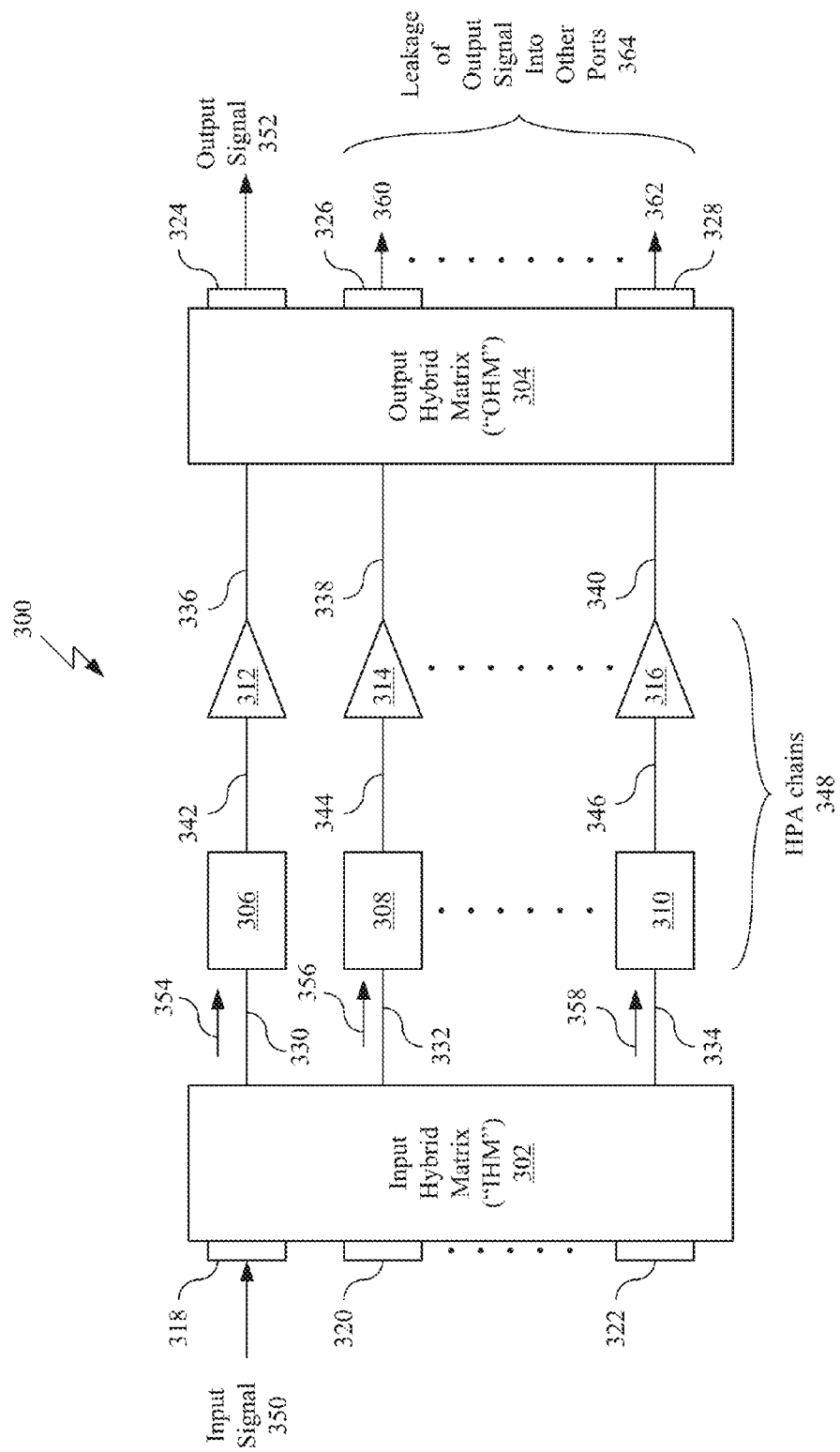
FIG. 3 is a block diagram of an example of an implementation of a known multi-port power amplifier ("MPA") for use in a multi-beam communication satellite shown in FIG. 2.
Figure 4:
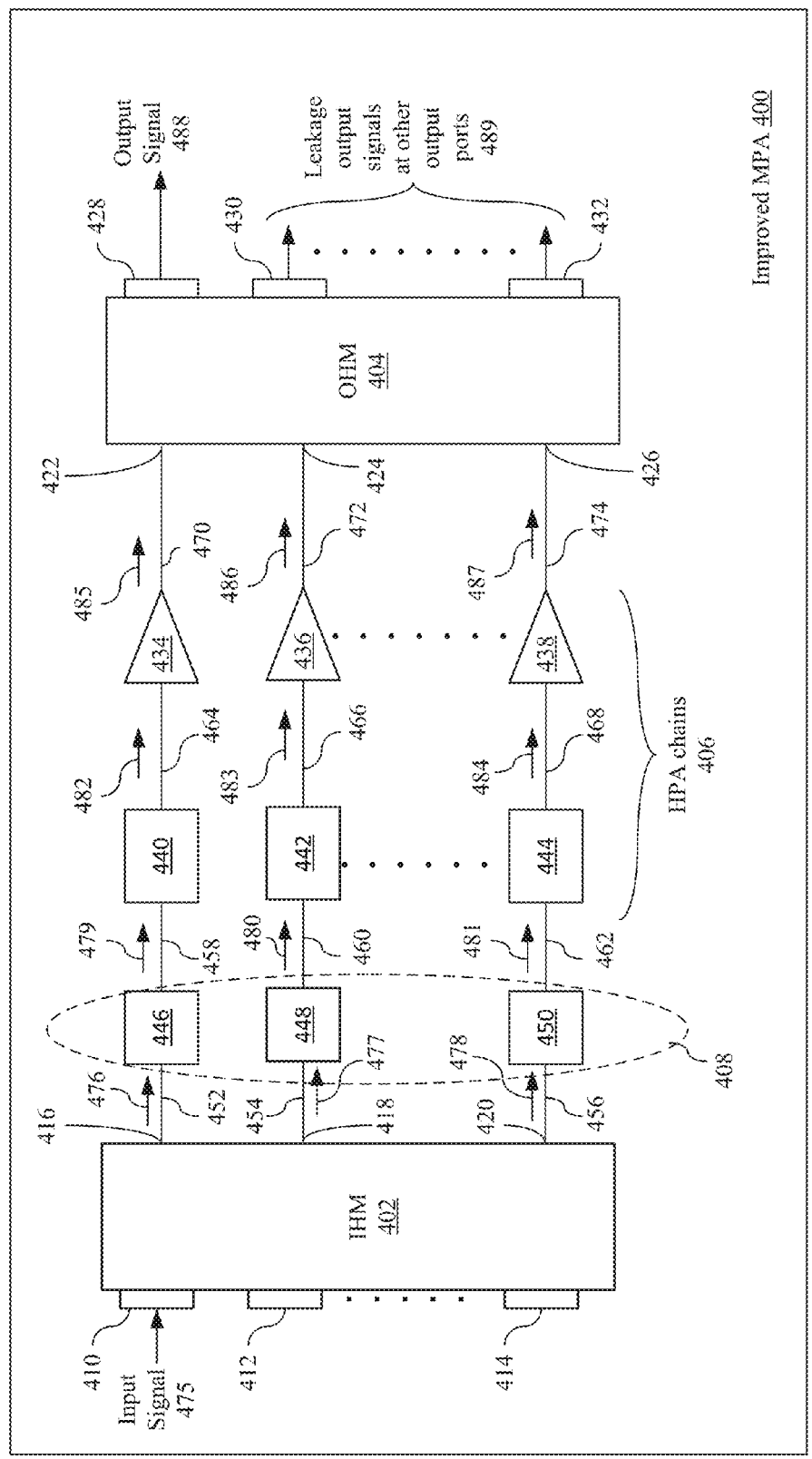
FIG. 4 is a block diagram of an example of an implementation of an improved MPA utilizing an adjustable delay module in accordance with the present invention.

In FIG. 4, a block diagram of an example of an implementation of an improved MPA 400 utilizing an adjustable delay module in accordance with the present invention is shown. Similar to the MPA 300 (shown in FIG. 3) the improved MPA 400 also includes an IHM 402, OHM 404, and a plurality of HPA chains 406. Unlike the MPA 300, the improved MPA 400 also includes a plurality of ADMs 408 in signal communication with the IHM 402 and plurality of HPA chains 406. In this example, the IHM 402 may include a plurality of input ports 410, 412, and 414 and output ports 416, 418, and 420. Similarly, the OHM 404 may also include a plurality of input ports 422, 424, and 426 and output ports 428, 430, and 432. The HPA chains 406 may include a plurality of HPAs 434, 436, and 438 and a plurality of phase, attenuation, or combination of both adjustment modules (also known as "tuning mechanisms") 440, 442, and 444, respectively. The plurality of ADMs 408 may include ADMs 446, 448, and 450.

In this example, the output ports 416, 418, and 420 of IHM 402 may be in signal communication with the ADMs 446, 448, and 450 via signal paths 452, 454, and 456, respectively. The tuning mechanisms 440, 442, and 444 are in signal communication with the ADMs 446, 448, and 450 and HPAs 434, 436, and 438 via signal paths 458, 460, 462, 464, 466, and 468, respectively. The input ports 422, 424, and 426 of the OHM 404 may be in signal communication with the HPAs 434, 436, and 438 via signal paths 470, 472, and 474, respectively.

It is appreciated by those skilled in the art that the circuits, components, modules, and/or devices of, or associated with, the improved MPA 400 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

In FIG. 4, it is appreciated by those of ordinary skill in the art that in this example while only three (3) HPAs 434, 436, and 438, three (3) tuning mechanisms 440, 442, and 444, and three (3) ADMs 446, 448, and 450 are shown, this number is for convenience of illustration and it is appreciated that there may be N HPAs, tuning mechanisms, and ADMs. In general, each combination of tuning mechanisms and HPA may be considered a HPA chain (resulting in the plurality of HPA chains 406) because it is appreciated that while each tuning mechanism 440, 442, and 444 is shown prior to each HPAs 434, 436, and 438, respectively, in FIG. 4, the order may be optionally reversed with the resulting reversed HPA chain still being functionally equivalent.

In an example of operation, an input signal 475 may be injected into the first input port 410 of the IHM 402. The input signal 475 is then divided up into N IHM output signals 476, 477, and 478 that are output and passed to the N ADMs 446, 448, and 450 via signal paths 452, 454, and 456, respectively. The ADMs 446, 448, and 450 introduce an adjustable delay on the N IHM output signals 476, 477, and 478 to produce N delayed IHM output signals 479, 480, and 481 that are passed to the N tuning mechanisms 440, 442, and 444 via signal paths 458, 460, and 462, respectively. The N tuning mechanisms 440, 442, and 444 then tune N delayed IHM output signals 479, 480, and 481 in phase, amplitude, or both, and pass the N tuned signals 482, 483, and 484 to the HPAs 434, 436, and 438, respectively. The HPAs 434, 436, and 438 amplify the N tuned signals 482, 483, and 484 to produce N amplified sub-signals 485, 486, and 487 that are injected in the input ports 422, 424, and 426 of the OHM 404. The OHM 404 then combines the received N amplified sub-signals 485, 486, and 487 to produce a first output signal 488 that is output from the first output port 428 of the OHM 404. If properly matched and adjusted for in delay, phase, and amplitude by the N ADMs 446, 448, and 450, tuning mechanisms 440, 442, and 444, and HPAs 434, 436, and 438, the OHM 404 will only produce the first output signal 488 from the output port 428. However, if not properly matched and adjusted for in delay, phase, and amplitude, the OHM 404 will also produce leakage output signals 489 from the other output ports 430 and 432 of the OHM 404. In this example, N is an integer number equal to $2^n$, where n is equal to 1 or greater.

It is appreciated by those of ordinary skill in the art that when reference is made to changing the delay, it is meant that a delay change is a change in phase slope over frequency which results in different phase changes at every frequency versus the type of phase changes made by the N tuning mechanisms, which change the phase equally across all frequencies.

In this example, the IHM 402 is generally a power divider and the OHM 404 is generally a power combiner. The IHM 402 and OHM 404 may be implemented as two complementary N by N (i.e., N×N) Butler matrix networks that include a plurality of 90 degree hybrid networks (not shown) resulting in an N×N improved MPA 400. Additionally, each tuning mechanism 440, 442, and 444 is generally an equalizer and each HPA 434, 436, and 438 may be an amplifier unit such as, for example, a traveling wave tube amplifier ("TWTA") or solid state amplifier. Specifically, each equalizer may provide, as a minimum, adjustment of gain and phase response and may also provide a single gain and phase adjustment, or multiple adjustments based on the frequency and amplitude of the N IHM output signals 476, 477, and 478 provided by the IHM 402.

As discussed earlier in general, each combination of tuning mechanism 440, 442, and 444 and HPA 434, 436, and 438 may be considered a HPA chain; however, it is appreciated that while each tuning mechanism 440, 442, and 444 is shown prior to each HPAs 434, 436, and 438, respectively, the order may be optionally reversed with each tuning mechanism 440, 442, and 444 shown after each HPAs 434, 436, and 438. In this alternative arrangement, the resulting HPA chains are still functionally equivalent.

Figure 5:
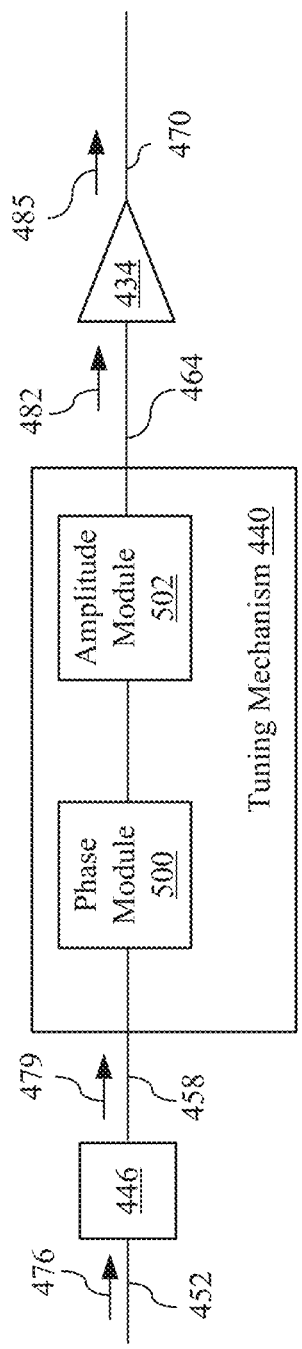
FIG. 5 is a block diagram of an example of an implementation of the tuning mechanism in accordance with the present invention.

In FIG. 5, a block diagram of an example of an implementation of the tuning mechanism 440 is shown in accordance with the present invention. In this example, the tuning mechanism 440 may include a phase adjustment module 500 and an amplitude adjustment module 502. The phase adjustment module 500 may include an adjustable phase shifter that is configured to adjust the phase response of the delayed IHM output signal 479. The amplitude adjustment module 502 may include an attenuator, an amplifier, or both that is configured to equalize the gain response of the delayed IHM output signal 479. The ADM 446 is a module that is configured to be a delay function that may be realized both in hardware (i.e., utilizing phase shifters and/or delay lines) or digitally with a processor as part of signal processing the IHM output signal 476.

It is appreciated that the other tuning mechanisms 442 and 444 may also each include a phase adjustment module and amplitude adjustment module. In this example, the combined ADMs 446, 448, and 450 and tuning mechanisms 440, 442, and 444 allows the improved MPA 400 to be tuned to higher isolation over the operating bandwidth of operation versus the MPA 300 shown in FIG. 3. This is the result of better matching the phase responses of the signal paths through the N ADMs 446, 448, and 450 and HPA chains 406.

Figure 6:
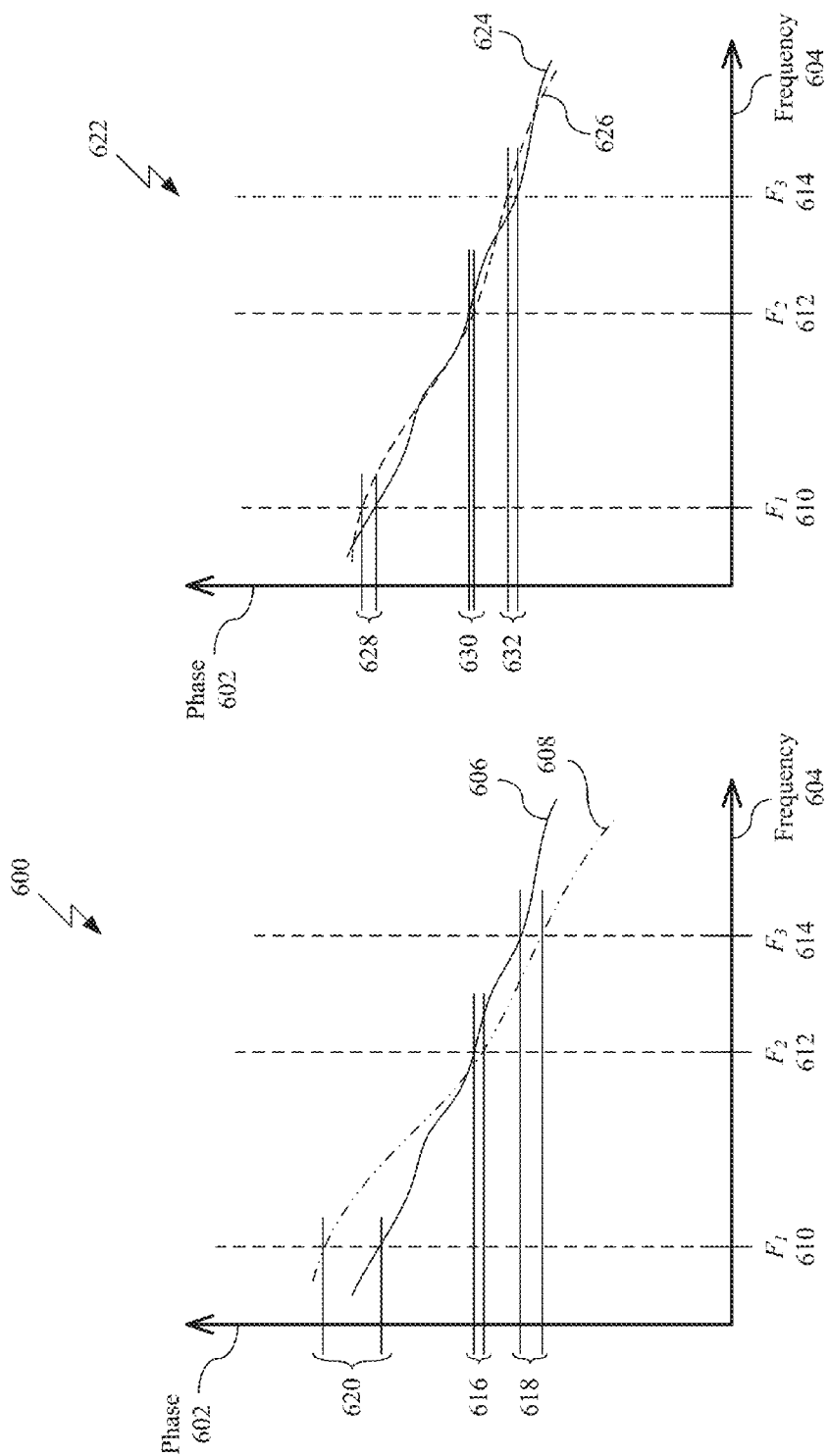
FIG. 6A is a graphical representation of an example of a plot of phase versus frequency of a corrected phase response of an MPA at a single frequency.
FIG. 6B is a graphical representation of an example of another plot of phase versus frequency of a corrected phase response of the improved MPA between the first-end frequency $F_1$ and second-end frequency $F_3$ in accordance with the present invention.

Turning to FIG. 6A, a graphical representation of an example of a plot 600 of phase 602 versus frequency 604 of a corrected phase response of an MPA at a single frequency is shown. In this example, it is assumed that the MPA is similar to the MPA 300 (of FIG. 3) and is a 2×2 MPA that includes two HPA chains with differing phase responses 606 and 608 across a first frequency $F_1$ 610, second frequency $F_2$ 612, and third frequency $F_3$ 614. In this example, the first frequency $F_1$ 610 may be a first-end frequency $F_1$ 610 of the operational bandwidth. The second frequency $F_2$ 612 may be a center frequency of the operational bandwidth and the third frequency $F_3$ 614 may be a second-end frequency $F_3$ 614 of the operational bandwidth.

In this example, the MPA is phase adjusted at a single frequency, for example, at the third frequency $F_3$ 614. The plot 600 shows that this type of MPA will have a narrow band of good performance centered at frequency $F_2$ 612 that corresponding has a relatively small phase error 616 between the two phase responses 606 and 608. However, in this example, the performance degrades at a wider band that moves away from frequency $F_2$ 612 where the phase errors 618 and 620 between the two phase responses 606 and 608 are much larger than the phase error 616 centered at frequencies $F_2$ 612. It is appreciated that these phase errors 616, 618, and 620 are directly related to the amount of leakage signals produced by the output ports of the OHM of the MPA which need to be minimized.

In FIG. 6B, a graphical representation of an example of another plot 622 of phase 602 versus frequency 604 of a corrected phase response of the improved MPA 400 between the first-end frequency $F_1$ 610 and second-end frequency $F_3$ 614 is shown in accordance with the present invention. In this example, it is also assumed that the improved MPA is a 2×2 MPA that includes two HPA chains with differing phase responses 624 and 626 across the first frequency $F_1$ 610, second frequency $F_2$ 612, and third frequency $F_3$ 614. In this example, the improved MPA utilizes the ADMs to effectively tilt the phase responses 624 and 626 relative to one another in a way that reduces the phase errors 628, 630, and 632 across the wider operational bandwidth between the first-end frequency $F_1$ 610 and second-end frequency $F_3$ 614. This tilting of the phase responses 624 and 626 is generally related to adding additional path length to or removing path length from the signal path from the IHM to the OHM via the ADM, tuning mechanism, and HPA, where the additional path length is added via the ADM.

Figure 7:
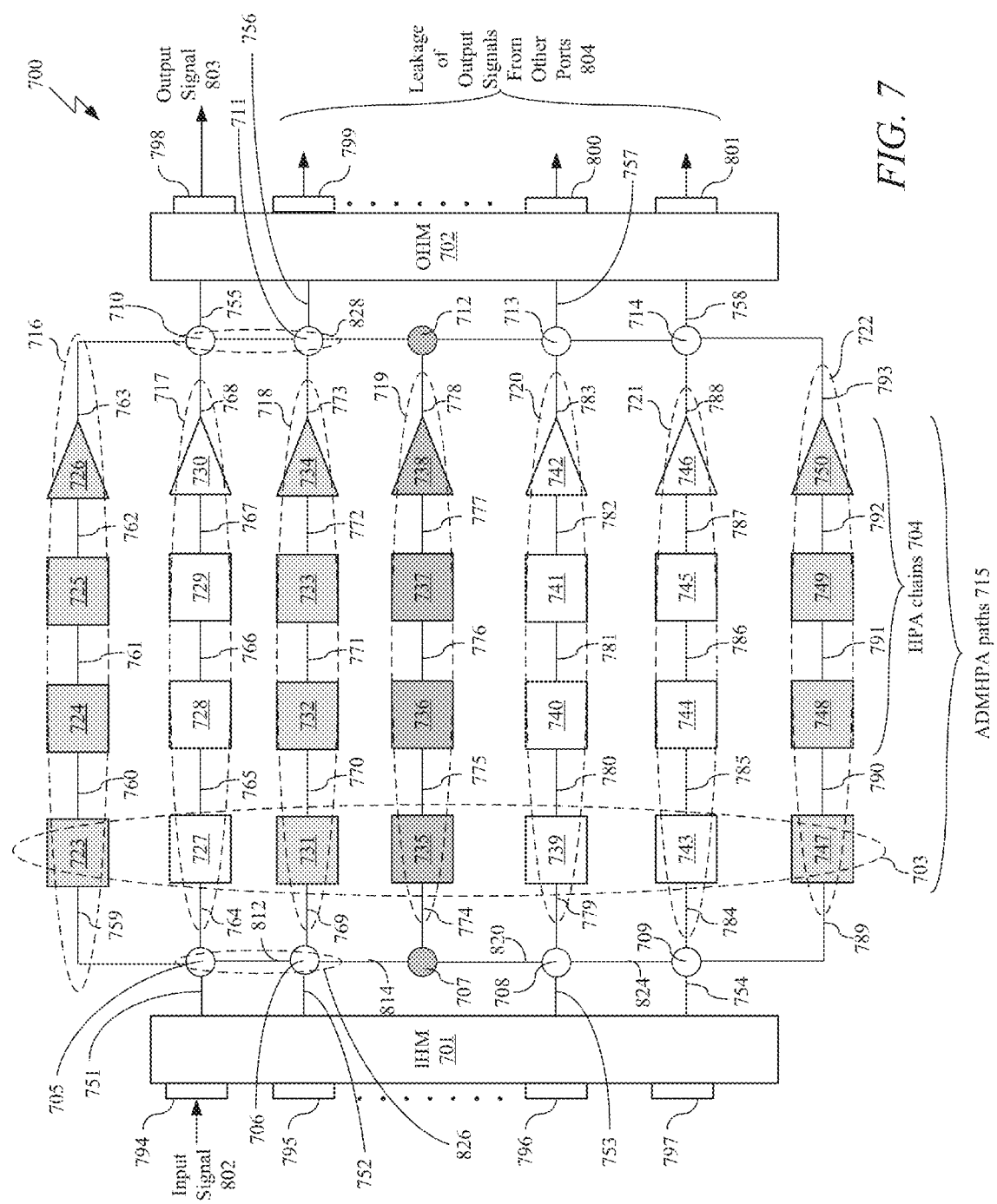
FIG. 7 is a block diagram of an example of another implementation of an improved MPA utilizing an adjustable delay module in accordance with the present invention.

Turning to FIG. 7, a block diagram of an example of another implementation of an improved MPA 700 utilizing an adjustable delay module is shown in accordance with the present invention. Similar to the example shown in FIG. 4, the improved MPA 700 also includes an IHM 701, OHM 702, and a plurality of ADMs 703 and a plurality of HPA chains 704. However, in this example, the improved MPA 700 also includes a plurality of input switches 705, 706, 707, 708, and 709 and output switches 710, 711, 712, 713, and 714. The input and output switches 705, 706, 707, 708, 709, 710, 711, 712, 713, and 714 allow the configuration of multiple redundancy rings composed of the ADMs and HPA chains such that the improved MPA 700 is capable of accommodating any number of spare ADMs and HPA chain combinations and tolerating multiple failures. Additionally in this example, each tuning mechanism of the corresponding HPA chain (of the plurality of HPA chains 704) is shown as an adjustable phase module and adjustable amplitude module. Moreover, the resulting combined ADM and HPA chains are each referred to as an "ADMHPA path" such that the improved MPA 700 is shown having seven (7) ADMHPA paths 715. It is appreciated by those of ordinary skill in the art that only seven (7) ADMPHA paths 715 are shown for convenience of illustration and that the number of ADMHPA paths 715 may include two or more ADMHPA paths 715 without departing from the spirit of the present invention.

In this example, it is appreciated by those of ordinary skill in the art that the input switches 705, 706, 707, 708, and 709 are generally referred to, and known as, "input" switches of the ADMHPA paths 715 but they may also be considered "output" switches of the IHM 701 because they are switches that receive the output signals from IHM 701. Similarly, it is also appreciated by those of ordinary skill in the art that the output switches 710, 711, 712, 713, and 714 are generally referred to, and known as, "output" switches of the of the ADMHPA paths 715 but they are also considered "input" switches of the OHM 702 because they are configured to receive the input signals to the OHM 702 that are output by the ADMHPA paths 715. In general, the input switches 705, 706, 707, 708, and 709 are low-power switches because they are configured to switch the relatively low power signal produced by the IHM 701, while the output switches 710, 711, 712, 713, and 714 are high-power switches because they are configured to switch the high power signals produced by the HPA chains 704. For purposes of this application, the input switches 705, 706, 707, 708, and 709 may also be referred to as "ADM switches" and the output switches 710, 711, 712, 713, and 714 may be referred to as "OHM switches."

Returning to FIG. 7, in this example, the plurality of ADMHPA paths 715 includes first ADMPHA path 716, second ADMPHA path 717, third ADMPHA path 718, fourth ADMPHA path 719, fifth ADMPHA path 720, sixth ADMPHA path 721, and seventh ADMPHA path 722. The first ADMHPA path 716 includes ADM 723, adjustable phase module 724, adjustable amplitude module 725, and HPA 726. The second ADMHPA path 717 includes ADM 727, adjustable phase module 728, adjustable amplitude module 729, and HPA 730. The third ADMHPA path 718 includes ADM 731, adjustable phase module 732, adjustable amplitude module 733, and HPA 734. The fourth ADMHPA path 719 includes ADM 735, adjustable phase module 736, adjustable amplitude module 737, and HPA 738. The fifth ADMHPA path 720 includes ADM 739, adjustable phase module 740, adjustable amplitude module 741, and HPA 742. The sixth ADMHPA path 721 includes ADM 743, adjustable phase module 744, adjustable amplitude module 745, and HPA 746. The seventh ADMHPA path 722 includes ADM 747, adjustable phase module 748, adjustable amplitude module 749, and HPA 750.

In this example, the IHM 701 is in signal communication with the input switches 705, 706, 708, and 709 via signal paths 751, 752, 753, and 754, respectively. Similarly, the OHM 702 is in signal communication with the output switches 710, 711, 713, and 714 via signal paths 755, 756, 757, and 758, respectively. With regard to the ADMHPA paths 715, for the first ADMHPA path 716, the ADM 723 is in signal communication with the input switch 705 and adjustable phase module 724 via signal paths 759 and 760, respectively. The adjustable amplitude module 725 is in signal communication with the adjustable phase module 724 and HPA 726 via signal paths 761 and 762, respectively, and the HPA 726 is in signal communication with the output switch 710 via signal path 763. For the second ADMHPA path 717, the ADM 727 is in signal communication with the input switch 705 and adjustable phase module 728 via signal paths 764 and 765, respectively. The adjustable amplitude module 729 is in signal communication with the adjustable phase module 728 and HPA 730 via signal paths 766 and 767, respectively, and the HPA 730 is in signal communication with the output switch 710 via signal path 768. For the third ADMHPA path 718, the ADM 731 is in signal communication with the input switch 706 and adjustable phase module 732 via signal paths 769 and 770, respectively. The adjustable amplitude module 733 is in signal communication with the adjustable phase module 732 and HPA 734 via signal paths 771 and 772, respectively, and the HPA 734 is in signal communication with the output switch 711 via signal path 773. For the fourth ADMHPA path 719, the ADM 735 is in signal communication with the input switch 707 and adjustable phase module 736 via signal paths 774 and 775, respectively. The adjustable amplitude module 737 is in signal communication with the adjustable phase module 736 and HPA 738 via signal paths 776 and 777, respectively, and the HPA 738 is in signal communication with the output switch 712 via signal path 778. For the fifth ADMHPA path 720, the ADM 739 is in signal communication with the input switch 708 and adjustable phase module 740 via signal paths 779 and 780, respectively. The adjustable amplitude module 741 is in signal communication with the adjustable phase module 740 and HPA 742 via signal paths 781 and 782, respectively, and the HPA 742 is in signal communication with the output switch 713 via signal path 783. For the sixth ADMHPA path 721, the ADM 743 is in signal communication with the input switch 709 and adjustable phase module 744 via signal paths 784 and 785, respectively. The adjustable amplitude module 745 is in signal communication with the adjustable phase module 744 and HPA 746 via signal paths 786 and 787, respectively, and the HPA 746 is in signal communication with the output switch 714 via signal path 788. For the seventh ADMHPA path 722, the ADM 747 is in signal communication with the input switch 709 and adjustable phase module 748 via signal paths 789 and 790, respectively. The adjustable amplitude module 749 is in signal communication with the adjustable phase module 748 and HPA 750 via signal paths 791 and 792, respectively, and the HPA 750 is in signal communication with the output switch 714 via signal path 793.

The IHM 701 has a plurality of input ports 794, 795, 796, and 797 and the OHM 702 has a plurality of output ports 798, 799, 800, and 801. As described earlier, if the improved MPA 700 is operating properly, in general, an input signal 802 input into the first input port 794 of the IHM 701 will produce a single output signal 803 at a first output port 798 of the OHM 702. However, as described earlier if the improved MPA 700 is not operating properly, there will be leakage of output signals 804 from the other output ports 799, 800, and 801 of the OHM 701.

In this example, out of the seven ADMHPA paths 715 the improved MPA 700 includes three redundancy rings between the IHM 701 and OHM 702. Specifically, in this example the improved MPA 700 is shown to have an 7:4 redundancy ring between the IHM 701 and OHM 702 because there a total of seven ADMHPA paths 715 between the IHM 701 and OHM 702 that include a first redundancy path 716 (corresponding to the first ADMHPA path 716), second redundancy path 719 (corresponding to the fourth ADMHPA path 719), and third redundancy path 722 (corresponding to the seventh ADMHPA path 722). As described earlier, the first redundancy path 716 includes ADM 723, adjustable phase module 724, adjustable attenuation module 725, and HPA 726 along signal paths 759, 760, 761, 762, and 763. The second redundancy path 719 includes ADM 735, adjustable phase module 736, adjustable attenuation module 737, and HPA 738 along signal paths 774, 775, 776, 777, and 778 and the third redundancy path 722 includes ADM 747, adjustable phase module 748, adjustable attenuation module 749, and HPA 750 along signal paths 789, 790, 791, 792, and 793.

It is appreciated by those of ordinary skill in the art that while the improved MPA 700 is shown with four main ADMHPA paths 717, 718, 720, and 721 and three redundancy paths 716, 719, and 722, the improved 700 may have a different number of ADMHPA and redundancy paths based on the design of the improved MPA 700. Specifically, while the IHM 701 and OHM 702 are shown with only four input ports 794, 795, 796, and 797 and four output ports 798, 799, 800, and 802 in FIG. 7, it is appreciated that the dotted lines between input ports 795 and 796 and output ports 799 and 800 illustrates that there could be optionally more input ports to the IHM 701 and output ports from the OHM 702 resulting in a larger improved MPA 700. Likewise, if there are more input and output ports in the improved MPA 700 there will also be more non-redundancy ADMHPA paths 715 so as to correspond to the number of input and output ports.

Furthermore, in this example, the first input switch 705 may switch between the second ADMHPA path 717, the ADMHPA path 716 (i.e., first redundancy path), and the third ADMHPA path 718. Additionally, the second input switch 706 may switch between the second ADMHPA path 717, the third ADMHPA path 718, and the fourth ADMHPA path 719 (i.e., the second redundancy path). Similarly, the third input switch 708 may switch between the fifth ADMHPA path 720, the second redundancy path 719, and sixth ADMHPA path 721. Moreover, the fourth input switch 709 may switch between the fifth ADMHPA path 720, sixth ADMHPA path 721, and seventh ADMHPA path 722 (i.e., the third redundancy path).

In this example, in order to switch to the second redundancy path 719, the second input switch 706 is also passed to the fifth input switch 707 that is in signal communication with the second input switch 706, ADM 735, and third input switch 708 via signal paths 803, 774, and 804, respectively. Similarly, the third input switch 708 may switch between the second redundancy path 819, fifth ADMHPA path 720, and sixth ADMHPA path 721. In this example, the third input switch 708 is in signal communication with the fourth input switch 709 via signal path 805.

Because of the plurality of ADMs 703, the improved MPA 700 is configured with a delay adjust functionality within the improved MPA 700 that enables redundancy ring designs that may accommodate any number of spares (i.e., redundancy paths) and tolerate multiple failures of different ADMHPA paths. As an example of operation, a redundancy path (for example the signal path from the third ADMHPA path 718 to second redundancy path 719) typically introduces additional signal path lengths 806 and 807 when switching from the third ADMHPA path 718 to second redundancy path 719. This additional signal length generally causes a tilting in the phase response (as described in relation to FIGS. 6A and 6B) that generally increases the phase error between the different ADMPHA paths 718. As a result, the ADMs 703 are configured to correct the phase tilt error of the phase response caused by switching to a redundant path within the improved MPA 700. As such, the improved MPA 700 is configured to have redundancy rings with multiple redundancy paths so as to be more than single fault tolerant. Again, in this example, the improved MPA 700 is shown to be three fault tolerant having three redundancy paths 716, 712, and 722. It is appreciated that additional redundancy paths may also be optionally included within the ADMHPA paths 715.

It is also appreciated that the placement of the plurality of ADMs 703 may be moved to a position prior to the input switches 705, 706, 707, 708, and 709. In this alternative example of an implementation, the number of ADMs 703 may be reduced because the delay function is located prior to the input switches 705, 706, 707, 708, and 709 such that a single ADM (or at least a smaller number of ADMs than the number of ADMs 703) may act as a delay function for multiple HPA chains 704 that are in signal communication with the corresponding input switch that is in signal communication with the single ADM. As an example, if the ADMs were moved prior to the input switches 705, 706, 707, 708, and 709 of the improved MPA 700 shown in FIG. 7, four ADMs (instead of the seven (7) ADMs 723, 727, 731, 735, 739, 743, and 747) could be utilized to provide any needed delay adjustment to any of the seven HPA chains 704. If for example, a first ADM was placed prior to the first input switch 705, the first ADM would be configured to provide the required delay adjustment for the path chosen by the first input switch 705 that would include the second ADMHPA path 717 and first redundant path 716. This would result in the replacement of both ADMs 723 and 727 located after the first input switch 705 with one single ADM located prior to the first input switch 705. Similarly, a second ADM prior to the second input switch 706 would result in the replacement of both ADMs 731 and 735 located after the second input switch 706 with one single ADM located prior to the second input switch 706. Additionally, a third ADM prior to the third input switch 708 would result in the replacement of both ADMs 739 and 735 located after the third input switch 708 with one single ADM located prior to the third input switch 708. Moreover, a fourth ADM prior to the fourth input switch 709 would result in the replacement of both ADMs 743 and 747 located after the fourth input switch 709 with one single ADM located prior to the fourth input switch 709.

Similar to the improved MPA 400 of FIG. 4, it is appreciated that the IHM 701 is generally a power divider and the OHM 702 is generally a power combiner. As an example, the IHM 701 and OHM 702 may be two complementary N×N Butler matrix networks that include a plurality of 90 degree hybrid networks (not shown). Additionally, each adjustment module 724, 725, 728, 729, 732, 733, 736, 737, 740, 741, 744, 745, 748, and 749 is generally a phase or amplitude adjustment module, component, or circuit and each HPA 726, 730, 734, 738, 742, 746, and 750 may be an amplifier unit such as, for example, a TWTA or solid state amplifier. Specifically, each adjustment module may provide, as a minimum, adjustment of gain and phase response and may also provide a single gain and phase adjustment, or multiple adjustments based on the frequency and amplitude of the intermediate signals provided by the IHM 701.

Again, it is also appreciated by those of ordinary skill in the art that in this example while only seven (7) ADMHPA paths 715 are shown, this number is for convenience of illustration and it is appreciated that there may be N ADM-HPA paths 715. In general, each combination of adjustment modules 724, 725, 728, 729, 732, 733, 736, 737, 740, 741, 744, 745, 748, and 749 and HPA 726, 730, 734, 738, 742, 746, and 750 may be considered a HPA chain (resulting in a plurality of HPA chains 715) because it is appreciated that while each adjustment module 724, 725, 728, 729, 732, 733, 736, 737, 740, 741, 744, 745, 748, and 749 is shown prior to each HPA 726, 730, 734, 738, 742, 746, and 750, respectively, in FIG. 7, the order may be optionally reversed with the reversed HPA chain still be functionally equivalent. Additionally, ADMs and output switches described in FIGS. 4 and 7 may be constructed as a network of delay lines and switches. The delay lines may be selected from any available type of transmission line and the switches could be mechanical, solid state, or digitally implemented by, for example, a digital signal processor ("DSP") or computer processor. The transmission lines and switches may be implemented utilizing coaxial cables, waveguides, micro-strip, or strip-line technologies. If the delay lines are implemented digitally, the delay values may also be represented by digital values.

Additionally disclosed is a system for measuring multi-port amplifier errors ("SME") of the improved MPA, where the improved MPA has a plurality of input ports and a plurality of output ports. The SME may include at least one input coupler, an output array of couplers, an input switch network, an output switch network, and a combiner. The at least one input coupler is in signal communication with at least a one input port of the plurality of input ports of the improved MPA. The output array of couplers includes a plurality of output couplers and the plurality of output couplers are in signal communication with the plurality of output ports of the improved MPA. The input switch network is in signal communication with the at least one input coupler and the input switch network is configured to receive a test signal and, in response, inject the test signal into the at least one input coupler. The output switch network is in signal communication with the plurality of output couplers of the output array of couplers. Furthermore, the combiner is in signal communication with the output switch network and is configured to receive a reference signal and to combine the reference signal with a processed test signal to produce a combined test and reference signal. The processed test signal is a signal created as a result of passing the test signal through the input switch network, at least one input coupler, improved MPA, an output coupler, and output switch network and the test signal and reference signal are coherent generated signals.

In an example of operation, the SME performs a process for adjusting at least one HPA chain of the improved MPA. The process may include receiving a coherently generated reference signal and test signal. The process then routes the test signal to at least one input port of a plurality of input ports of the improved MPA and then receives a plurality of output test signals from a plurality of output ports of the improved MPA. The process then routes a processed test signal to a combiner and the combiner combines the processed test signal with the reference signal to produce a combined test and reference signal. The process then determines a difference between the processed test signal and reference signal from the combined test and reference signal.

Figure 8:
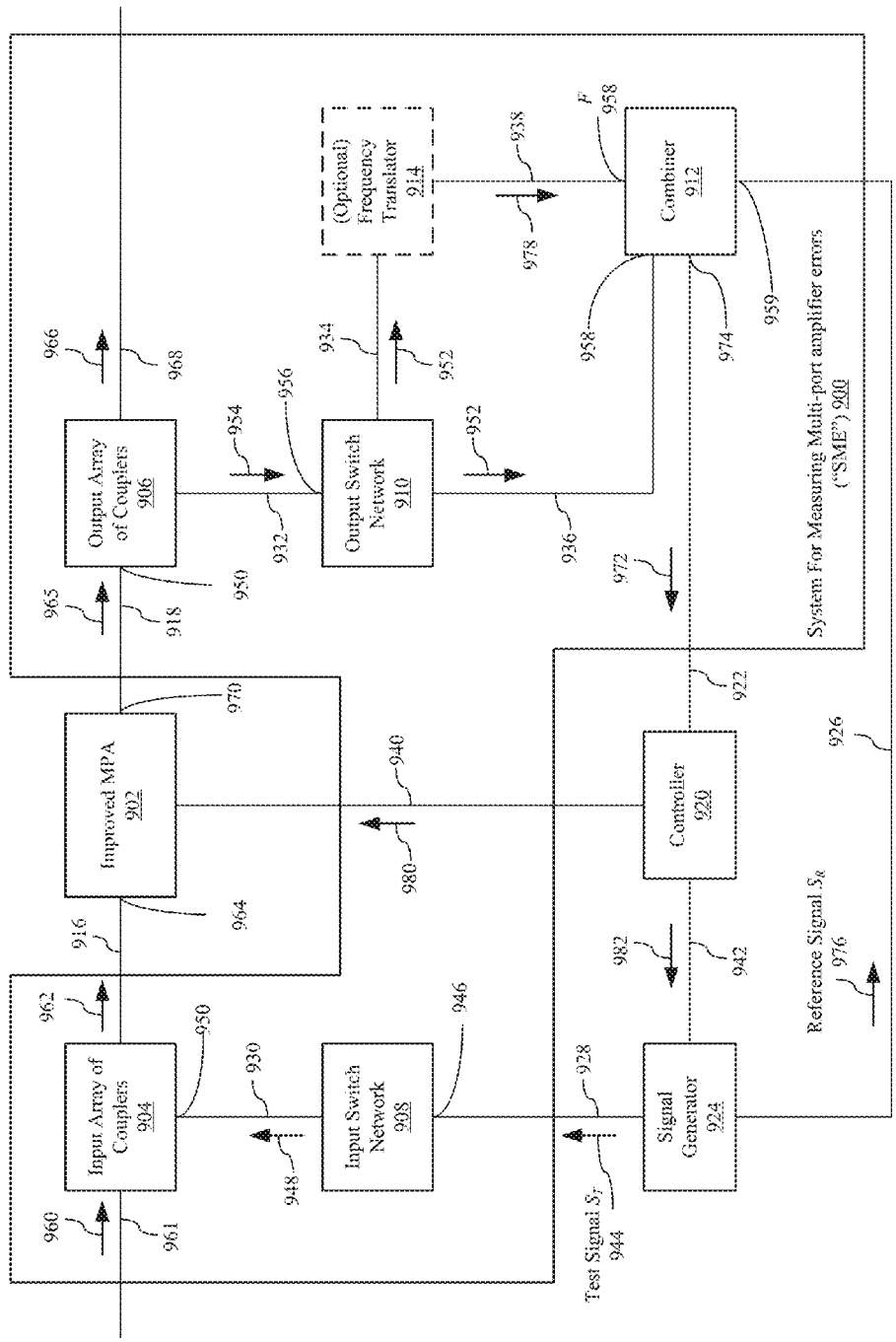
FIG. 8 is a block diagram of an example of an implementation of a system for measuring multi-port amplifier errors ("SME") of the improved MPA in accordance with the present invention.

More specifically, in FIG. 8, a block diagram of an example of an implementation of a system for measuring multi-port amplifier errors ("SME") 900 is shown in accordance with the present invention. The SME 900 is configured to measure the errors of the improved MPA 902. The SME 900 may include an input array of couplers 904, output array of couplers 906, input switch network 908, output switch network 910, and combiner 912. The SME 900 may also include an optional frequency translator 914.

In this example, the SME 900 is in signal communication with the improved MPA 902, via signal paths 916 and 918 and in signal communication with a controller 920 via signal path 922. Moreover, the SME 900 may be in signal communication with a signal generator 924 via signal paths 926 and 928. The SME 900 optionally may be also in signal communication with a frequency source (not shown) that is also in signal communication with the signal generator 924.

Furthermore, in this example within the SME 900, the input array of couplers 904 is in signal communication with improved MPA 902 and input switch network 908 via signal paths 916 and 930, respectively. The output array of couplers 906 is in signal communication with improved MPA 902 and output switch network 910 via signal paths 918 and 932, respectively. The output switch network 910 is in signal communication with the optional frequency translator 914 or combiner 912 (if no frequency translator 914 present) via signal paths 934 or 936. If there is a frequency translator 914, the frequency translator 914 is in signal communication with the output switch network 910 and combiner via signal paths 934 and 938, respectively. The controller 920 is in signal communication with the combiner 912, improved MPA 902, and signal generator 924 via signal paths 922, 940, and 942, respectively.

In this example, the input switch network 908 may be a circuit, device, component, or module that generally is a switch matrix that is configured to route and/or cycle an input signal to multiple outputs. The input switch network 908 may be hardware based, software based, or both. As an example, it may include subcomponents such as switches, couplers, mixers, amplifiers, attenuators, and splitters. In general, the input switch network 908 is configured to receive an input signal 944 from the signal generator 924, via signal path 928, at the input 946 of the input switch network 908 and, in response, sequentially inject the input signal 948 into an input 950 of the input array of couplers 904 via signal path 930.

Similarly, the output switch network 910 may be also a circuit, device, component, or module that generally is a switch matrix that is configured to route and/or cycle multiple outputs from the output array of couplers 906 to a single output signal 952. The output switch network 910 may be also hardware based, software based, or both and may include subcomponents such as switches, couplers, mixers, amplifiers, attenuators, and splitters. In general, the output switch network 910 is configured to receive a plurality of output signals 954 from the output array of couplers 906, via signal path 932, at the input 956 of the output switch network 910 and, in response, sequentially produce the output signal 952 that is passed into input 958 of the combiner 912 via signal path 936. If the optional frequency translator 914 is present, the output signal 952 is passed instead to the frequency translator 914 via signal path 934 which is then passed to input 958 of the combiner 912.

In this example, the input array of couplers 904 includes a set of a plurality of couplers (not shown) that are configured to allow input signals 960 (from signal path 961 from other external devices (not shown)) to the improved MPA 902 to pass through the individual couplers (not shown) of the plurality of couplers of the input array of couplers 904 to the plurality of inputs (not shown) of the improved MPA 902. The individual couplers of the input array of couplers 904 are also configured to pass the input signal 948 that is sequentially injected into the input array of couplers 904 to a corresponding input port (not shown) of the improved MPA 902. The resulting signal, or signals, 962 are then injected into the input 964 of the improved MPA 902.

Similarly, the output array of couplers 906 includes a set of a plurality of couplers (not shown) that are configured to allow an output signal, or signals, 965 from the improved MPA 902 to pass through the individual couplers (not shown) of the plurality of couplers of the output array of couplers 906 to produce a system output signal 966 that may be passed to external devices (such as, for example, multiple antennas) from the SME 900 via signal path 968. The individual couplers of the output array of couplers 906 are also configured to receive the output signal, or signals, 965 from the plurality of output ports 970, from the improved MPA 902, and pass the coupled signals 954 to the output switch network 910 via signal path 932.

In this example, the individual couplers of both the input array of couplers 904 and output array of couplers 906 may be passive or active couplers. Examples of passive couplers include coax, waveguide, micro-strip, and strip-line directional couplers or coupled-line couplers. Examples of active couplers may be solid-state couplers.

The combiner 912 may be any type of summation circuit, device, component, or module that is configured to receive two input signals and combine them into a combined output signal 972 that is passed from the output port 974 to the controller 920 via signal path 922. The combiner 912 may be an active or passive device. In this example, if the optional frequency translator 914 is not present, the combiner 912 is configured to receive the output signal 952 from the output switch network 910 (via signal path 936) and a reference input signal $S_R$ 976 from the signal generator 924 (via signal path 926) and, in response, combine them to produce the combined output plus reference signal 972 that is passed to the controller 920. If, instead, the optional frequency translator 914 is present, the combiner 912 is configured to receive the output signal 978 from the optional frequency translator 914 (via signal path 938) and the reference input signal $S_R$ 976 and, in response, combine them to produce the combined output plus reference signal 972 that is passed to the controller 920.

The signal generator 924 may be any type of electronic circuit, device, component, or module that is configured to produce repeating or non-repeating analog or digital signals. The signal generator 924 may include a frequency source (not shown) either within the signal generator or in signal communication with the signal generator, where the frequency source is capable of producing a stable reference signal waveform. An example of a frequency source would include an oscillator. In this example, the signal generator 924 is configured to produce the test signal $S_T$ 944 and reference signal $S_R$ 976 as two coherent signals. The reference signal $S_R$ 976 may also be referred to as a calibration tone. Additionally, the combiner 912 may optionally receive clock information (i.e., a clock signal) from the frequency source (not shown) so as to coherently combine the reference signal $S_R$ 976 to produce the combined output plus reference signal 972. It is appreciated by those of ordinary skill in the art that the reference signal $S_R$ 976 and test signal $S_T$ 944 may each be a type of signal selected from the group consisting of a tone signal, modulated tone signal, pseudo-random noise code ("$P_n$") signal, Walsh code signal, or other types of orthogonal spreading code digital signal.

In this example, it is appreciated by those of ordinary skill in the art that the entire SME 900 may be located within the same flight vehicle (such as, for example, a satellite in orbit) or part of the SME 900 may be located in the flight vehicle while another part of the SME 900 may be located at a ground station in signal communication with the flight vehicle but remote from the flight vehicle. As an example, the combiner 920 may be located within the SME 900, external to the SME 900 but located within the same flight vehicle, or at a ground station (not shown) in signal communication with the output switch network 910 located on the flight vehicle.

The controller 920 may be a capture device that captures the combined output plus reference signals 972 as the input switch network 908 cycles (i.e., selects) through which individual couplers (of the input array of couplers 904) have been injected with the input signal 948 produced by the input switch network 908 cycling the test signal $S_T$ 944. The controller 920 is configured to determine the differences between the resulting output signal (i.e., output signal 952 or output signal 978) that was produced by the entire system and injected into another input port 959 of the combiner 912 and the reference signal $S_R$ 976. These differences are utilized by the controller 920 to determine any errors introduced by the improved MPA 902 on the test signal $S_T$ 944 as it is processed by the improved MPA 902. In response, the controller 920 may send correction signals 980 to the improved MPA 902 via signal path 940. The correction signals 980 may be signals that adjust the delay of ADMs, phase of the phase adjustment modules, and gain of the attenuation adjustment modules of the improved MPA 902.

Moreover, the controller 920 may also send control signals 982 to the signal generator 924, via signal path 942, to adjust the frequency of the test signal $S_T$ 944 so as to test the improved MPA 902 across different frequencies within the bandwidth of operation of the improved MPA 902. In general, the controller 920 may include sub-components such as, for example, a signal measurement module (not shown), calculation module (not shown), analog-to-digital converters ("A/D"), digital-to-analog converters ("D/A"), processor (not shown), memory (not shown), software (not shown), etc. The controller 920 may include both hardware and software and may be implemented utilizing a microprocessor, microcontroller, digital signal processing ("DSP"), application specific integrated circuit ("ASIC"), or other similar type devices. Similar to the controller 920, the controller 920 may also be located within the SME 900, external to the SME 900 but located within the same flight vehicle, or at a ground station (not shown) in signal communication with the SME 900 on the flight vehicle.

The frequency translator 914 is generally a circuit, device, component, or module that is configured to produce a frequency shift in the output signal 952 from the output switch network 910 via signal path 934. As an example, the frequency translator 914 may include a mixer (not shown) or modulator (not shown) that changes the frequency of the output signal 952 from the output switch network 910, to the new output signal 978 to the combiner 912.

It will be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

What is claimed is:

1. A multi-port power amplifier ("MPA") having an input hybrid matrix ("IHM"), an output hybrid matrix ("OHM"), and a plurality of high-power amplifier ("HPA") chains, the MPA comprising:
    a plurality of adjustable delay modules ("ADMs") in signal communication with the IHM and the plurality of HPA chains,
    a plurality of delay lines, and
    a plurality of ADM switches,
    wherein each adjustable delay module ("ADM") of the plurality of ADMs is in signal communication with the IHM and a corresponding HPA chain of the plurality of HPA chains and includes a delay line of the plurality of delay lines and an ADM switch of the plurality of ADM switches.

2. The MPA of claim 1,
    wherein the MPA is configured to operate across an operational bandwidth that includes
    a first-end frequency,
    a center frequency, and
    a second-end frequency,
    wherein each HPA chain of the plurality of HPA chains has a corresponding frequency response across the operational bandwidth that includes a phase response that slopes from the first-end frequency to the second-end frequency, and
    wherein each ADM is configured to tilt the phase response of each corresponding HPA chain relative to the other phase responses of the other HPA chains of the plurality of HPA chains.

3. The MPA of claim 2, wherein the plurality of ADMs are configured to tilt the phase response of each corresponding HPA chain relative to the other phase responses of the other HPA chains of the plurality of HPA chains so as to minimize a difference between all the phase responses.

4. The MPA of claim 2, further including a plurality of redundancy rings in the plurality of HPA chains.

5. The MPA of claim 4, further including a plurality of OHM switches in signal communication with the OHM, wherein each redundancy ring of the plurality of redundancy rings includes
    the ADM switch and an OHM switch of the plurality of OHM switches, and
    a first HPA chain and a second HPA chain of the plurality of HPA chains,
    wherein the ADM switch is in signal communication with the IHM and the first and the second HPA chains, and
    wherein the OHM switch is in signal communication with the OHM and the first and the second HPA chains.

6. The MPA of claim 4, further including a plurality of OHM switches in signal communication with the OHM, wherein each redundancy ring of the plurality of redundancy rings includes
    the ADM switch and an OHM switch of the plurality of OHM switches and
    a first HPA chain and a second HPA chain of the plurality of HPA chains,
    wherein the ADM is in signal communication with the IHM,
    wherein the ADM switch is in signal communication with the ADM and the first and second HPA chains, and
    wherein the OHM switch is in signal communication with the OHM and first and second HPA chains.

7. The MPA of claim 1,
    wherein the MPA is configured to operate across an operational bandwidth that includes
    a first-end frequency,
    a center frequency, and
    a second-end frequency,
    wherein each HPA chain of the plurality of HPA chains has a corresponding frequency response across the operational bandwidth that includes a phase response that slopes from the first-end frequency to the second-end frequency, and
    wherein each ADM is configured to tilt the phase response of each corresponding HPA chain relative to the other phase responses of the other HPA chains of the plurality of HPA chains.

8. The MPA of claim 7, wherein the plurality of ADMs are configured to tilt the phase response of each corresponding HPA chain relative to the other phase responses of the other HPA chains of the plurality of HPA chains so as to minimize a difference between all the phase responses.

9. The MPA of claim 2,
wherein the MPA has a plurality of input ports and a plurality of output ports,
wherein the plurality of input ports are in signal communication with the IHM,
wherein the plurality of output ports are in signal communication with the OHM,
wherein the MPA is in signal communication with a system for measuring multi-port amplifier errors ("SME") of the MPA,
wherein the SME is configured to inject a test signal into an input port of the plurality of input ports and, in response, produce a combined test and reference signal by combining a received processed signal produced by the MPA and a reference signal coherently related to the test signal, and
wherein the plurality of HPA chains are configured to be adjusted based on the combined test and reference signal.

10. The MPA of claim 9, wherein the plurality of ADMs are configured to be adjusted based on the combined test and reference signal.

11. A method for improving the performance of a multi-port power amplifier ("MPA") having an input hybrid matrix ("IHM"), an output hybrid matrix ("OHM"), and a plurality of high-power amplifier ("HPA") chains, across an operational bandwidth having a first-end frequency, a center frequency, and a second-end frequency, wherein each HPA chain of the plurality of HPA chains has a corresponding frequency response across the operational bandwidth that includes a phase response that slopes from the first-end frequency to the second-end frequency, the method comprising:
adjusting a delay of each HPA chain such that the slope of the corresponding phase response of each HPA chain is tilted relative to the other phase responses of the other HPA chains of the plurality of HPA chains, and
adjusting the phase and attenuation of each HPA chain,
wherein adjusting the phase and attenuation of each HPA chain includes adjusting the phase and attenuation of each HPA chain based on a combined test and reference signal produced by a system for measuring multi-port amplifier errors ("SME") of the MPA, and
wherein the SME is configured to inject a test signal into an input port of the IHM and, in response, produce the combined test and reference signal by combining a received processed signal produced by the MPA and a reference signal coherently related to the test signal.

12. The method of claim 11, wherein adjusting the delay of each HPA chain includes tilting the phase response of each corresponding HPA chain relative to the other phase responses of the other HPA chains of the plurality of HPA chains so as to minimize a difference between all the phase responses.

13. The method of claim 12, further including prior to adjusting the delay of each HPA chain, switching between a first HPA chain and a second HPA chain of the plurality of HPA chains.

14. The method of claim 13, further including after adjusting the delay of each HPA chain, switching between a first HPA chain and a second HPA chain of the plurality of HPA chains.

15. The method of claim 14, further including adjusting the phase and attenuation of each HPA chain.

16. The method of claim 15,
wherein adjusting the phase and attenuation of each HPA chain includes adjusting the phase and attenuation of each HPA chain based on a combined test and reference signal produced by the SME of the MPA and
wherein the SME is configured to inject a test signal into an input port of the IHM and, in response, produce the combined test and reference signal by combining a received processed signal produced by the MPA and a reference signal coherently related to the test signal.

17. A system for measuring multi-port amplifier errors ("SME") of a multi-port power amplifier (MPA) having a plurality of input ports, a plurality of output ports, and a plurality of high-power amplifier ("HPA") chains, the SME comprising:
at least one input coupler in signal communication with at least one input port of the plurality of input ports of the MPA;
a plurality of output couplers in signal communication with the plurality of output ports of the MPA;
an input switch network in signal communication with the at least one input coupler and configured to receive a test signal;
an output switch network in signal communication with the plurality of output couplers; and
a combiner in signal communication with the output switch network and configured to receive a reference signal.

18. The SME of an MPA of claim 17, wherein the SME is configured to inject a test signal into the at least one input port of the plurality of input ports of the MPA and, in response, produce a combined test and reference signal by combining a received processed signal produced by the MPA and a reference signal coherently related to the test signal.

19. The SME of an MPA of claim 18, wherein the plurality of HPA chains are configured to be adjusted based on the combined test and reference signal.

20. The SME of an MPA of claim 19, further including a frequency translator in signal communication with the output switch network and configured to produce a frequency shift in an output signal from the output switch network.

* * * * *